(12) United States Patent
Khakifirooz et al.

(10) Patent No.: US 10,832,766 B2
(45) Date of Patent: Nov. 10, 2020

(54) PROGRAM VERIFICATION TIME REDUCTION IN NON-VOLATILE MEMORY DEVICES

(71) Applicant: Intel Corporation, Santa Clara, CA (US)

(72) Inventors: Ali Khakifirooz, Los Altos, CA (US); Pranav Kalavade, San Jose, CA (US); Uday Chandrasekhar, Santa Clara, CA (US); Trupti Bemalkhedkar, Folsom, CA (US); Chang Wan Ha, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,814

(22) Filed: Sep. 28, 2018

(65) Prior Publication Data

US 2019/0043563 A1  Feb. 7, 2019

(51) Int. Cl.
*G11C 16/06* (2006.01)
*G11C 11/56* (2006.01)
*G11C 16/04* (2006.01)
*G11C 16/34* (2006.01)

(52) U.S. Cl.
CPC ...... *G11C 11/5628* (2013.01); *G11C 11/5642* (2013.01); *G11C 16/0483* (2013.01); *G11C 16/3459* (2013.01); *G11C 2211/561* (2013.01); *G11C 2211/5621* (2013.01)

(58) Field of Classification Search
CPC ............ G11C 11/5628; G11C 11/5642; G11C 16/0483
USPC ...................................... 365/185.22
See application file for complete search history.

(56) References Cited

U.S. PATENT DOCUMENTS

| | | | |
|---|---|---|---|
| 8,705,273 B2 * | 4/2014 | Kim ................... | G11C 5/14 365/185.03 |
| 2008/0117683 A1 * | 5/2008 | Hemink ............. | G11C 11/5621 365/185.19 |
| 2019/0057751 A1 * | 2/2019 | Lee .................... | G11C 16/10 |

* cited by examiner

*Primary Examiner* — Huan Hoang
*Assistant Examiner* — Minh Dinh
(74) *Attorney, Agent, or Firm* — Schwabe, Williamson & Wyatt, P.C.

(57) ABSTRACT

An apparatus and/or system is described including a memory device or a controller to perform programming and verification operations including application of a shared voltage level to verify two program voltage levels of a multi-level cell device. For example, in embodiments, the control circuitry performs a program operation to program a memory cell and performs a verification operation by applying a single or shared verify voltage level to verify that the memory cell is programmed to a corresponding program voltage level. In embodiments, the program voltage level is one of two consecutive program voltage levels of a plurality of program voltage levels to be verified by application of the shared verify voltage. Other embodiments are disclosed and claimed.

14 Claims, 8 Drawing Sheets

PROGRAM VERIFICATION TIME REDUCTION IN NON-VOLATILE MEMORY DEVICES

FIELD

Embodiments of the present disclosure generally relate to the field of integrated circuits (IC), and more particularly, to non-volatile memory devices.

BACKGROUND

Program operation in a multi-level cell memory device typically requires a large number of program pulses and verify operations. The greater the number of program voltage levels that a memory cell can store, the greater the number of programming and verify operations that are performed by the memory device. For example, programming of a quad-level cell (QLC) NAND device is done more slowly relative to a triple-level cell (TLC) NAND device due in part because QLC NAND device programming requires a smaller spacing between threshold voltages of the memory cells compared to a TLC NAND device. Program performance, in particular, speed, of multi-level memory cell devices, e.g., QLC NAND devices, and in other multi-level memory cell devices can be improved.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
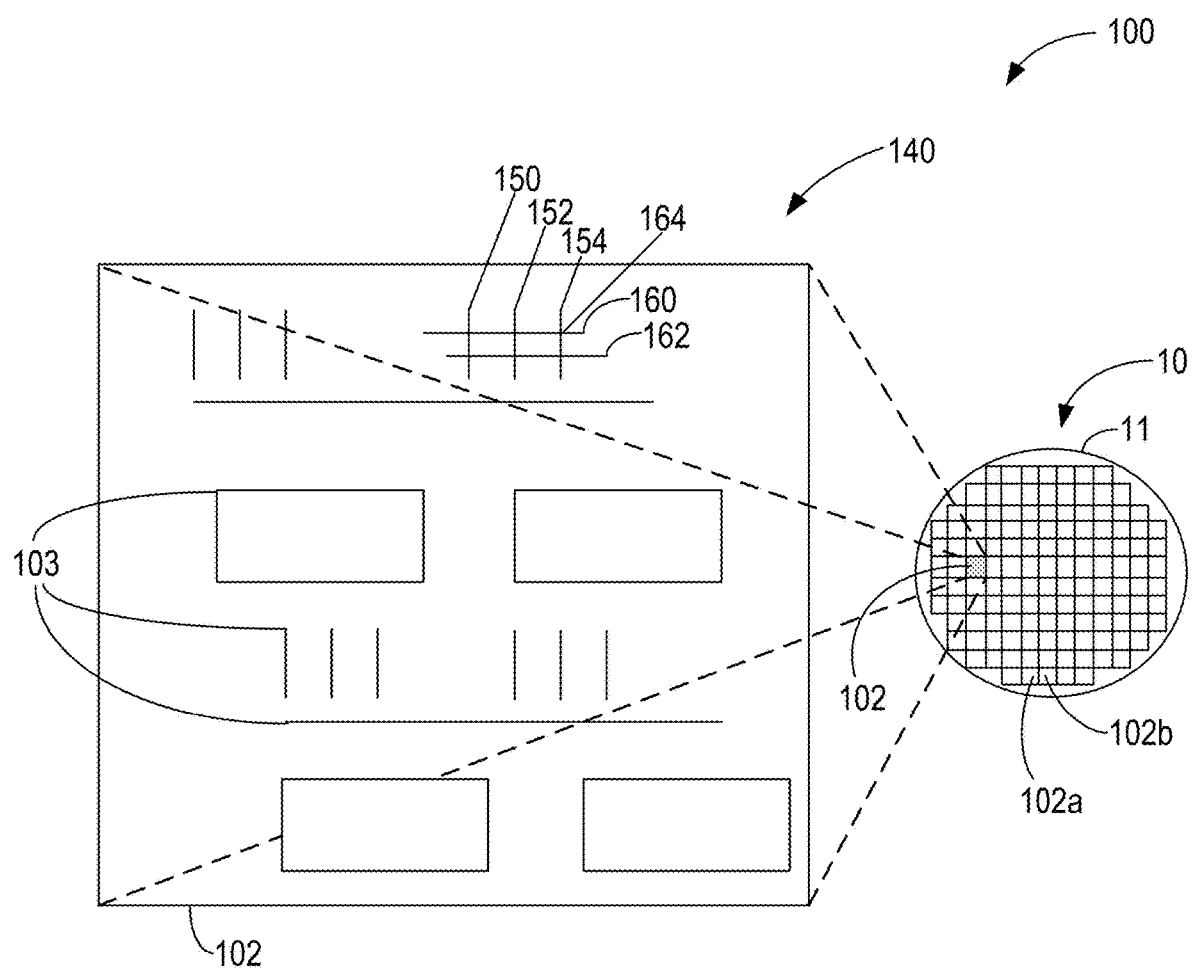
FIG. 1 illustrates an example die in which a memory device may be provided, in accordance with embodiments of the present disclosure.

In embodiments, control circuitry of a memory device performs programming and verification operations associated with programming verification time reduction including application of a shared voltage level to verify at least two program voltage levels of a multi-level cell device. For example, in embodiments, the control circuitry performs a program operation to program a plurality of memory cells and performs a verification operation by applying a single or shared verify voltage level to verify that the memory cells are programmed to a program voltage level. In embodiments, the program voltage level is one of two consecutive program voltage levels of a plurality of program voltage levels to be verified by application of the shared verify voltage level. In embodiments, the memory device or control circuitry compares a first bitline (BL) current of a first memory cell to a first BL reference current and a second BL current of a second memory cell to a second reference BL current to verify that first and second memory cells are programmed to respective first and second program voltage levels of the two consecutive program voltage levels. In embodiments, the first reference BL current and the second reference BL current are different reference currents.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

In some cases, various operations will be described as multiple discrete operations in turn, in a manner that is most helpful in understanding the present disclosure; however, the order of description should not be construed to imply that these operations are necessarily order dependent. In particular, these operations need not be performed in the order of presentation.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. Furthermore, it is to be understood that the various embodiments shown in the Figures ("FIGs.") are illustrative representations and are not necessarily drawn to scale.

FIG. 1 illustrates an example die in which a memory device may be provided using the techniques of the present disclosure, in accordance with some embodiments. More specifically, FIG. 1 schematically illustrates a top view of die 102 in wafer form 10 and in singulated form 140, in accordance with some embodiments. In some embodiments, the die 102 may be one of a plurality of dies (e.g., die 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that may include a memory device. For example, die 102 may include circuitry 103 and/or another memory device module or component as described herein to perform a program voltage verify time reduction by using a shared verify voltage level as described herein in accordance with some embodiments. According to various embodiments, the circuitry 103 may include one or more memory elements (memory cells, such as, e.g., multi-level per cell memory cells), which may be configured in an array, such as a two-dimensional (2D) or three-dimensional (3D) non-volatile multi-level cell (MLC) memory array. In some embodiments, the memory array may comprise a 3D multi-level per cell such as three-level-per-cell (TLC) or four-level-per-cell (QLC) NAND memory array. In some embodiments, the memory array may comprise a cross-point MLC memory array.

The circuitry 103 may further include one or more word-line(s) (also referred to as "WL" or "WLs") (e.g., 150, 152, 154) and one or more bitline(s) (also referred to as "BL" or "BLs") (e.g., 160, 162) coupled to the memory elements. Only three wordlines and two bitlines are shown in FIG. 1 for ease of understanding. In some embodiments, the bitlines and wordlines may be configured such that each of the memory elements may be disposed at an intersection (e.g., 164) of each individual bitline and wordline (e.g., 160 and 154), in a cross-point configuration. A voltage or bias can be applied to a target memory element of the memory elements using the wordlines and the bitlines to select the target memory cell for a read or write operation. Bitline drivers may be coupled to the bitlines and wordline drivers may be coupled to the wordlines to facilitate decoding/selection of the memory elements. To enable memory cell selection, the wordlines 150, 152, 154 may be connected with memory cells and other parts of circuitry 103 via interconnects, including respective contact structures (e.g., vias) that provide electrical connectivity through the layers of the die 102 as described below in greater detail. It is noted that the circuitry 103 is only schematically depicted in FIG. 1 and may represent a wide variety of suitable logic or memory in the form of circuitry or other suitable devices and configurations including, for example, one or more state machines including circuitry and/or instructions in storage (e.g., firmware or software) configured to perform actions such as read, program, verify and/or analysis operations in connection with a program verify time reduction as described herein.

In some embodiments, circuitry 103 may be formed using suitable semiconductor fabrication techniques, some of which are described herein. After a fabrication process of the semiconductor product is complete, the wafer 11 may undergo a singulation process in which each of the dies (e.g., die 102) may be separated from one another to provide discrete "chips" of the semiconductor product. The wafer 11 may be any of a variety of sizes. According to various embodiments, the circuitry 103 may be disposed on a semiconductor substrate in wafer form 10 or singulated form 140. In some embodiments, the die 102 may include logic or memory, or combinations thereof.

Figure 2:
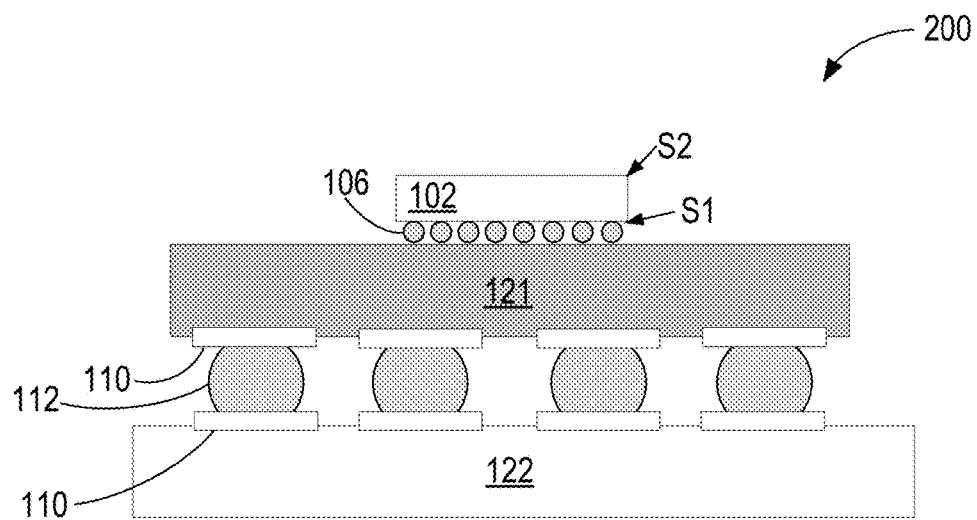
FIG. 2 schematically illustrates a cross-section side view of an integrated circuit (IC) assembly that may include a memory device, in accordance with embodiments of the present disclosure.

FIG. 2 schematically illustrates a cross-section side view of an integrated circuit (IC) assembly 200 that may include a memory device provided in accordance with some embodiments described herein. In some embodiments, the IC assembly 200 may include one or more dies electrically and/or physically coupled with a package substrate 121. The die 102 may include circuitry (e.g., circuitry 103 of FIG. 1) and/or other suitable components or modules to perform operations in connection with a program voltage verification time reduction as described herein. In some embodiments, the package substrate 121 is coupled with a circuit board 122, as shown.

The IC assembly 200 may include a wide variety of configurations including, for example, suitable combinations of flip-chip and/or wire-bonding configurations, interposers, multi-chip package configurations including System in Package (SiP) and/or Package on Package (PoP) configurations. For example, the die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, memory elements as described in reference to FIG. 1. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate 121 using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures, fabrication of some of which is described below.

In some embodiments, the package substrate 121 may comprise an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

In some embodiments, the package substrate 121 may be coupled with a circuit board 122, as can be seen. The circuit board 122 may be a printed circuit board (PCB) composed of an electrically insulative material such as an epoxy laminate. For example, the circuit board 122 may include electrically insulating layers composed of materials that may be laminated together. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 may be a motherboard and may be included in a computing device, such as, for example, a mobile device.

Package-level interconnects such as, for example, solder balls 112 may be coupled to pads 110 on the package substrate 121 and/or on the circuit board 122 to form corresponding solder joints that may be configured to further route the electrical signals between the package substrate 121 and the circuit board 122. The pads 110 may be composed of any suitable electrically conductive material such as metal. The package-level interconnect may include other structures and/or configurations including, for example, land-grid array (LGA) structures and the like. In embodiments, the die 102 of the IC assembly 200 may be, include, or be a part of an IC including a memory device, such as, e.g., a multi-level cell (MLC) non-volatile memory device as described herein.

Figure 3:
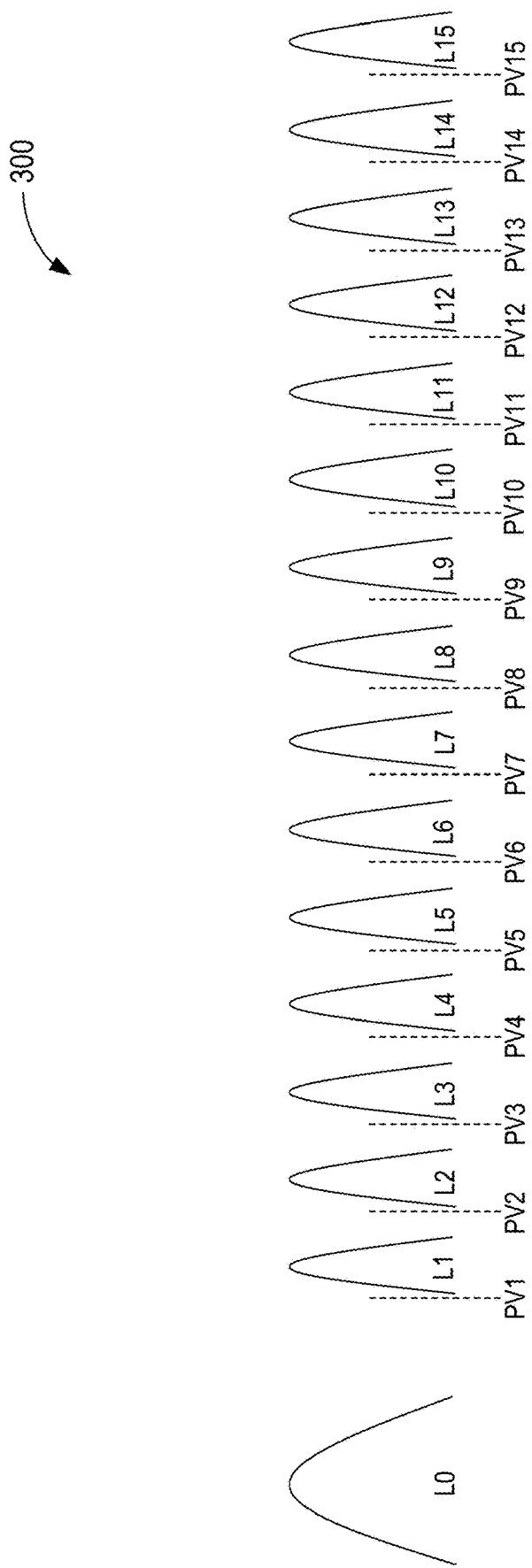
FIG. 3 includes a schematic representation of an example threshold voltage distribution of multi-level memory cells and corresponding program voltage verification levels, in accordance with embodiments of the present disclosure.

Program and verify operations in an MLC non-volatile memory device, such as a quad-level cell (QLC) NAND device, involves application of program voltage pulses and program voltage verify operations (or "verify operations"). To illustrate, FIG. 3 includes a schematic representation of a threshold voltage distribution 300 of memory cells of an example QLC NAND memory device, in embodiments. In threshold voltage distribution 300, voltage extends horizontally and a population of memory cells extends vertically. Based on data provided to the memory device, each memory cell of a QLC NAND device encodes 4 bits of data by programming each memory cell into one of 16 program voltage levels, e.g., L0 . . . L15. In order to program the memory cells, the memory device applies program voltage pulses of consecutive program voltage levels with incrementing magnitude to a selected wordline (WL) of the memory cell array. Each program voltage pulse may be followed by a corresponding verify operation. Verify operations include comparison of threshold voltage levels of memory cells targeted to be programmed into the consecutive program voltage levels L1 . . . L15 to their corresponding program verify voltage levels (or "verify levels"), e.g., ("PV"), PV1 . . . PV15.

Figure 4:
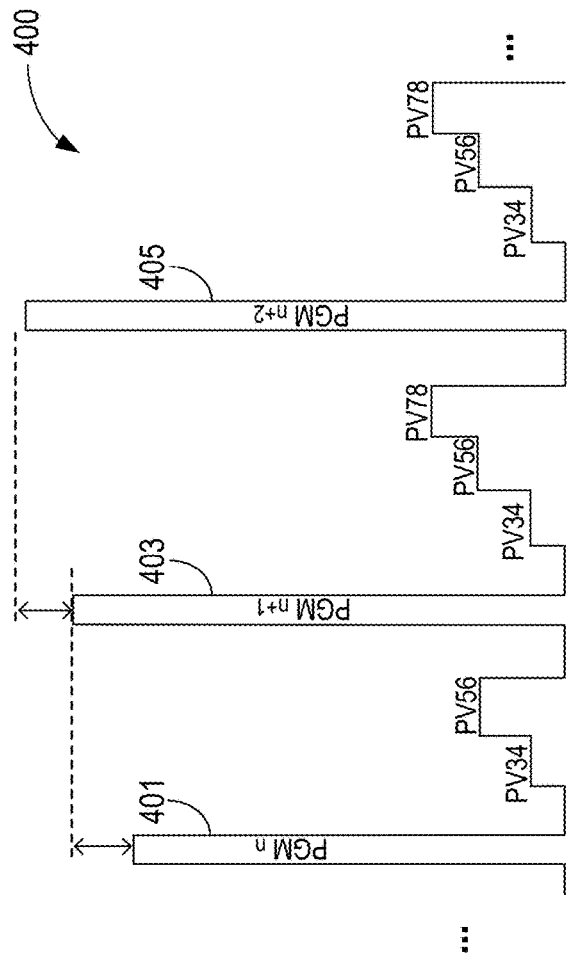
FIG. 4 is an example voltage waveform of a selected wordline illustrating program and verify operations, in accordance with embodiments of the present disclosure.

FIG. 4 illustrates an exemplary waveform 400 associated with a selected WL during programming operations according to embodiments. A voltage of waveform 400 is schematically depicted vertically and a time of waveform 400 is schematically depicted horizontally. In embodiments, a memory device or control circuitry coupled to an array of memory cells of the memory device performs a program operation to program a memory cell to a program voltage level (also "program level"). In embodiments, the program level is one of a plurality of consecutive program voltage levels, e.g., program voltage levels, L1 to L15 of FIG. 3, to be applied to the selected WL of the memory array. In the embodiment, after applying a program pulse $PGM_n$ (e.g., 401), the memory device applies a series of verify operations. In embodiments, however, rather than applying one verify level for each program voltage level, every two consecutive program levels correspond to a same or shared verify voltage level.

For example, as shown, after applying program pulse $PGM_n$ at 401, the memory device applies shared verify level PV34. In the embodiment, corresponding memory cells that are targeted to be programmed to program voltage levels L3 and L4 are then verified by comparing their BL currents against their respective reference currents (note that selection of reference currents is discussed further below in connection with FIG. 5). In embodiments, since only one WL ramp is used to verify program voltage levels L3 and L4, a wait time or delay for WL voltage to stabilize from verify level PV3 to verify level PV4 and a wait time for a BL current to stabilize to a corresponding memory cell current is eliminated. Hence, in embodiments, verification operation time is reduced. In embodiments, after corresponding memory cells targeted for program voltage levels L3 and L4 cells are verified, WL voltage is ramped to a second shared verify level PV56 and corresponding memory cells targeted to program voltage levels L5 and L6 are verified by comparing their BL currents against appropriate BL reference currents. In embodiments, a next program pulse $PGM_{n+1}$ (e.g., 403) is applied, followed by shared verify operations PV34 and PV56. In embodiments, a shared verify voltage PV78 is applied and memory cells targeted to program voltage level L7 are verified against the corresponding BL reference current. Next, for the embodiment, another program pulse $PGN_{n+2}$ (e.g., 405) is applied, followed by a next set of appropriate shared verify levels.

As will be discussed further with respect to FIG. 7, the control circuitry or memory device is to mark one or both of a first memory cell and a second memory cell as programmed according to a determination that one or both of the memory cells have passed a corresponding shared verify voltage level.

Note that in the illustrated example, it is assumed that at program pulse $PGM_n$, memory cells that are targeted to be programmed to program voltage levels L1 and L2 have already passed their respective verify levels, e.g., PV1 and PV2, and thus additional verification operations are not needed on corresponding memory cells. As discussed immediately below with respect to FIG. 5, in embodiments, control circuitry determines first and second respective values for a first reference BL current and a second reference BL current based at least in part on a function of the first bitline (BL) current and the second BL current and a respective WL voltage.

Figure 5:
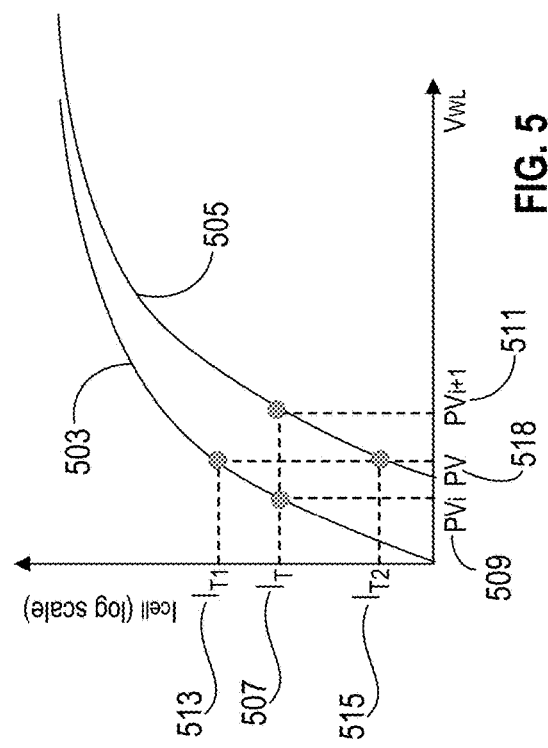
FIG. 5 is a current-voltage (I-V) graph associated with selection of reference current values for a verification operation, in accordance with embodiments of the present disclosure.

FIG. 5 is a graph illustrating a function associated with selection of BL reference currents or values ("reference currents"), in accordance with various embodiments. In embodiments, first and second reference currents are used to verify respective first and second consecutive program voltage levels at a single shared WL voltage level and thus a shared verify program voltage level. As shown, current level of a memory cell ($I_{cell}$) is schematically depicted vertically and a corresponding WL voltage ($V_{WL}$) is schematically depicted horizontally. For the embodiment, respective curves 503 and 505 represent current-voltage ("I-V") characteristics of respective memory cells, e.g., example memory cells, also referred to as 503 and 505. As illustrated, when verified at a single reference current $I_T$ (e.g., shown at 507), memory cells 503 and 505 are verified at separate respective verify levels, $PV_i$ and $PV_{i+1}$, (e.g., 509 and 511). In embodiments, however, to verify memory cell 503 at a shared verify program voltage PV (e.g., element 518), BL current of memory cell 503 is verified against a BL reference current $I_{T1}$ (e.g., element 513). In embodiments where the current-voltage characteristics of the cells can be represented by an exponential equation, memory cell 503 is verified at $I_{T1}=I_T \, 10^{(PV-PVi)/S}$ while memory cell 505 is verified at $I_{T2}=I_T \, 10^{(PV-PVi+1)/S}$ where S is the subthreshold slope of the memory cells. In general, other suitable reference currents $I_{T1}$ and $I_{T2}$ can be used based on the current-voltage characteristics of the cells. Accordingly, in embodiments, when two memory cells are verified at a single or shared verify voltage level, they are verified at different reference currents, e.g., $I_{T1}$ and $I_{T2}$, respectively. Note that in some embodiments, after a BL current of a memory cell is verified, the currents are compared against an additional reference current, e.g., reference currents $I'_{T1}$ or $I'_{T2}$, corresponding to a selective slow program convergence (SSPC) voltage threshold. In embodiments, memory cells designated for an SSPC program operation will be programmed at a slower rate during a next program operation.

Although the above embodiment focuses on an example QLC NAND memory device, e.g., QLC 3D-NAND non-volatile memory device, note that any suitable multi-level cell (MLC) memory device is contemplated where a single or shared verify voltage level can be applied to verify two or more consecutive program voltage levels.

Figure 6:
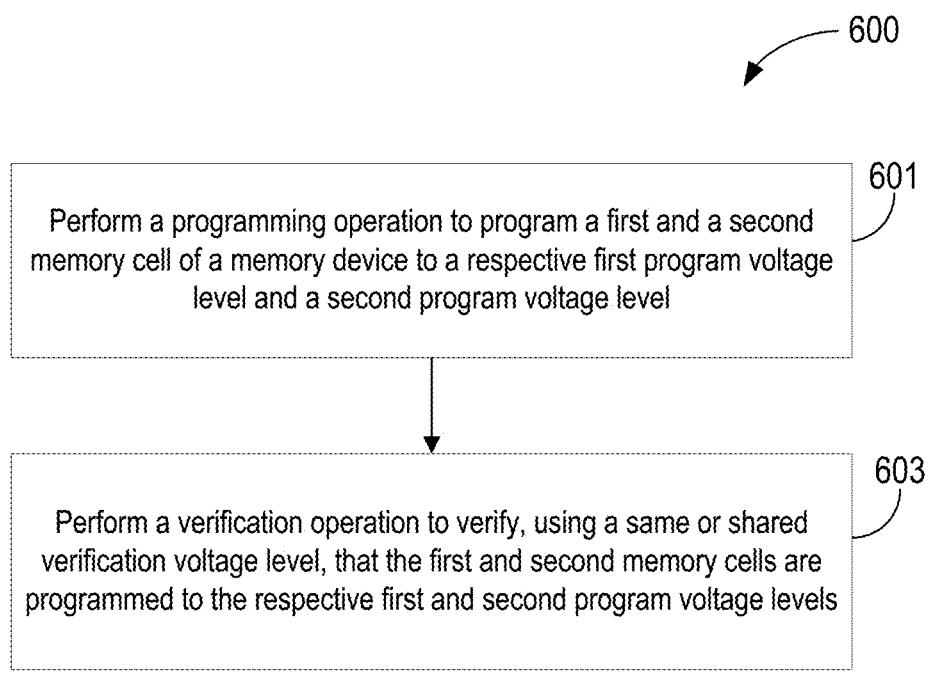
FIGS. 6 and 7 are flow diagrams illustrating example processes, in accordance with embodiments of the present disclosure.

FIG. 6 is a flow diagram illustrating a process 600 in connection with program verification time reduction of a memory device, in accordance with various embodiments. In embodiments, process 600 is performed by, e.g., control circuitry of a memory device or memory controller. For example, beginning at block 601, process 600 includes to perform a programming operation to program a first and a second memory cell of a memory device to a respective first program voltage level and a second program voltage level. In embodiments, the memory device is a non-volatile or flash memory device and as described above, where memory cells of the memory device are programmed to at least one of a plurality of threshold voltage levels. At a next block 603, process 600 includes performing a verification operation to verify, using a same or shared verify voltage level, that the first and second memory cells are programmed to the respective first and second program voltage levels. In embodiments, control circuitry is to apply the shared verify voltage level as a single verification voltage to a selected wordline (WL) of the first memory cell and the second memory cell. In embodiments, the first memory cell is included in a first plurality of target memory cells of an array to be programmed to a first program voltage level and the array further includes the second memory cell of a second plurality of target memory cells to be programmed to the second program voltage level.

Accordingly, in embodiments, block 603 includes to compare a first bitline (BL) current of the first memory cell to a first reference BL current and a second BL current of the second memory cell to a second reference BL current to verify that the first and second memory cells are programmed to the respective first program voltage level and the second program voltage level. In embodiments, e.g., the comparison includes performing a first sense operation to determine if a bitline (BL) current of the subject memory cell is less than a reference BL current and marking the corresponding memory cell according to the determination (e.g., as INH, further described below in connection with FIG.7). In some embodiments, process 600 includes performing a second sense operation on the first memory cell to determine if a subsequent BL current of the first memory cell is less than a selective slow program convergence (SSPC) threshold reference current, also further described below.

In embodiments, the BL comparisons are performed by sense circuitry included in or associated with control circuitry of the memory device. As further discussed below, in embodiments, with respect to FIGS. 8 and 9, sense circuitry including a sense capacitor is coupled to perform a sense operation to compare a first BL current and a second BL current to the respective first reference BL current and the second reference BL including to apply a boost voltage to the sense capacitor. In embodiments, process 600 includes to determine first and second respective values for the first reference BL current and second reference BL current based at least in part on a function of the first bitline (BL) current and the second BL current on a respective WL voltage. Note that in embodiments, control circuitry determines first and second respective values for a first reference BL current and a second reference BL current based at least in part on a function of a respective WL voltage (as discussed above with respect to FIG. 5).

Figure 7:
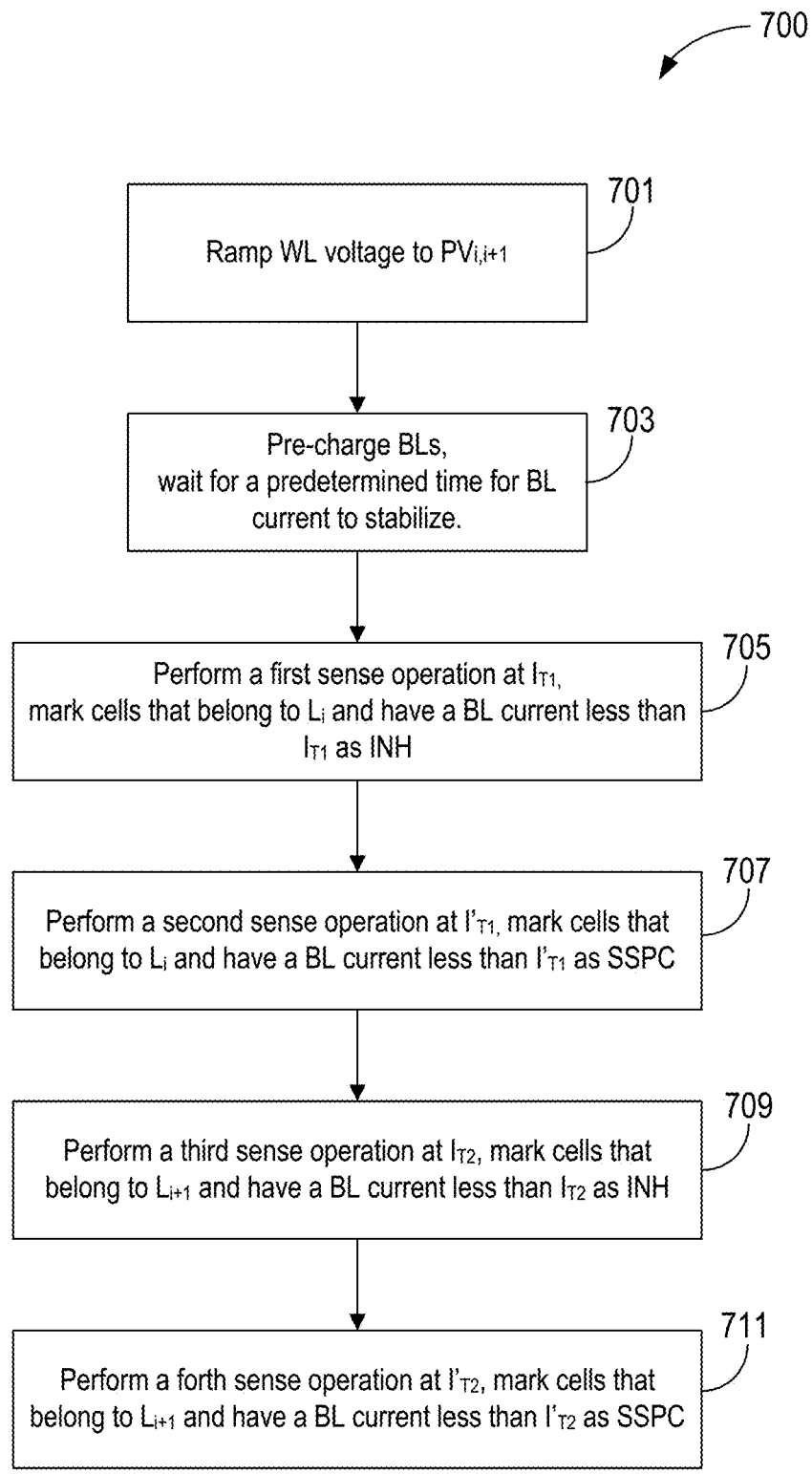

FIG. 7 is a flow diagram illustrating a process 700 in connection with performance of verification operations, in accordance with various embodiments. In embodiments, process 700 includes verification operations to verify that, e.g., a first and a second memory cell are programmed to two consecutive program voltage levels, e.g., $L_i$ and $L_{i+1}$. In embodiments, at a block 701, a selected WL voltage is ramped to a shared program verify voltage level ("verify voltage level"), denoted as $PV_{i,\ i+1}$. Next, in the embodiment, at block 703, BLs are precharged and a predetermined wait time is passed in order for BL currents to stabilize and match a corresponding memory cell current. In some embodiments, only BLs that are not yet inhibited are precharged to consume less power. In yet another embodiment, only BLs that belong to memory cells targeted to be programmed to voltage levels $L_i$ and $L_{i+1}$ that are not yet inhibited are precharged. In embodiments, at blocks 705-711, a selected BL current is compared against a plurality of reference BL current values, e.g., indicated as $I_{T1}$, $I'_{T1}$, $I_{T2}$, and $I'_{T2}$ that alternatively correspond to the inhibit (INH) and selective slow convergence (SSPC) threshold values for program voltage levels $L_i$ and $L_{i+1}$, respectively. Accordingly, at block 705, the memory device or control circuitry associated with the memory device performs a first sense operation, comparing the selected BL current to $I_{T1}$, and subsequently marks memory cells that are targeted to program voltage level $L_i$ and have a BL current less than $I_{T1}$ as INH. At a next block 707, the memory device performs a second sense operation at I'$_{T1}$ and subsequently marks memory cells that belong to L$_i$ and have BL current less than I'$_{T1}$ as designated for an SSPC operation during a next program operation. Next, for the embodiments, at block 709, the memory device performs a third sense operation at I$_{T2}$ and marks memory cells that are targeted to program voltage level L$_{i+1}$ and have BL current less than I$_{T2}$ as INH. Finally, at block 711, the memory device performs a fourth sense operation at reference current level, I'$_{T2}$ and marks memory cells that belong to L$_{i+1}$ and have current less than I'$_{T2}$ as designated for an SSPC operation. Note that while blocks 705-711 are shown in that order, verify operations can be performed in any suitable order, for example, 705, 709, 707, 711.

Figure 8:
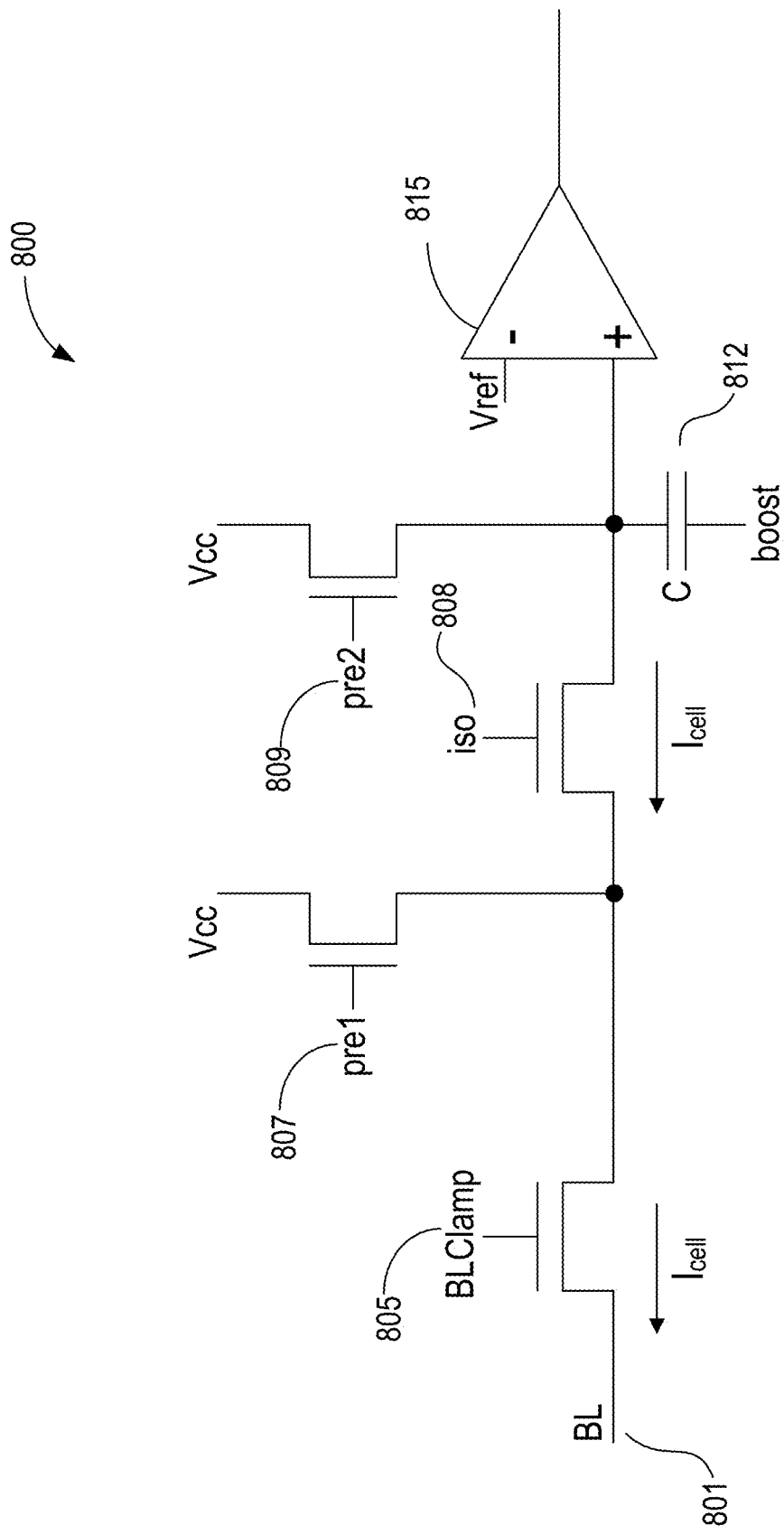
FIG. 8 is an example sense circuit associated with verification operations, in accordance with embodiments of the present disclosure.
Figure 9:
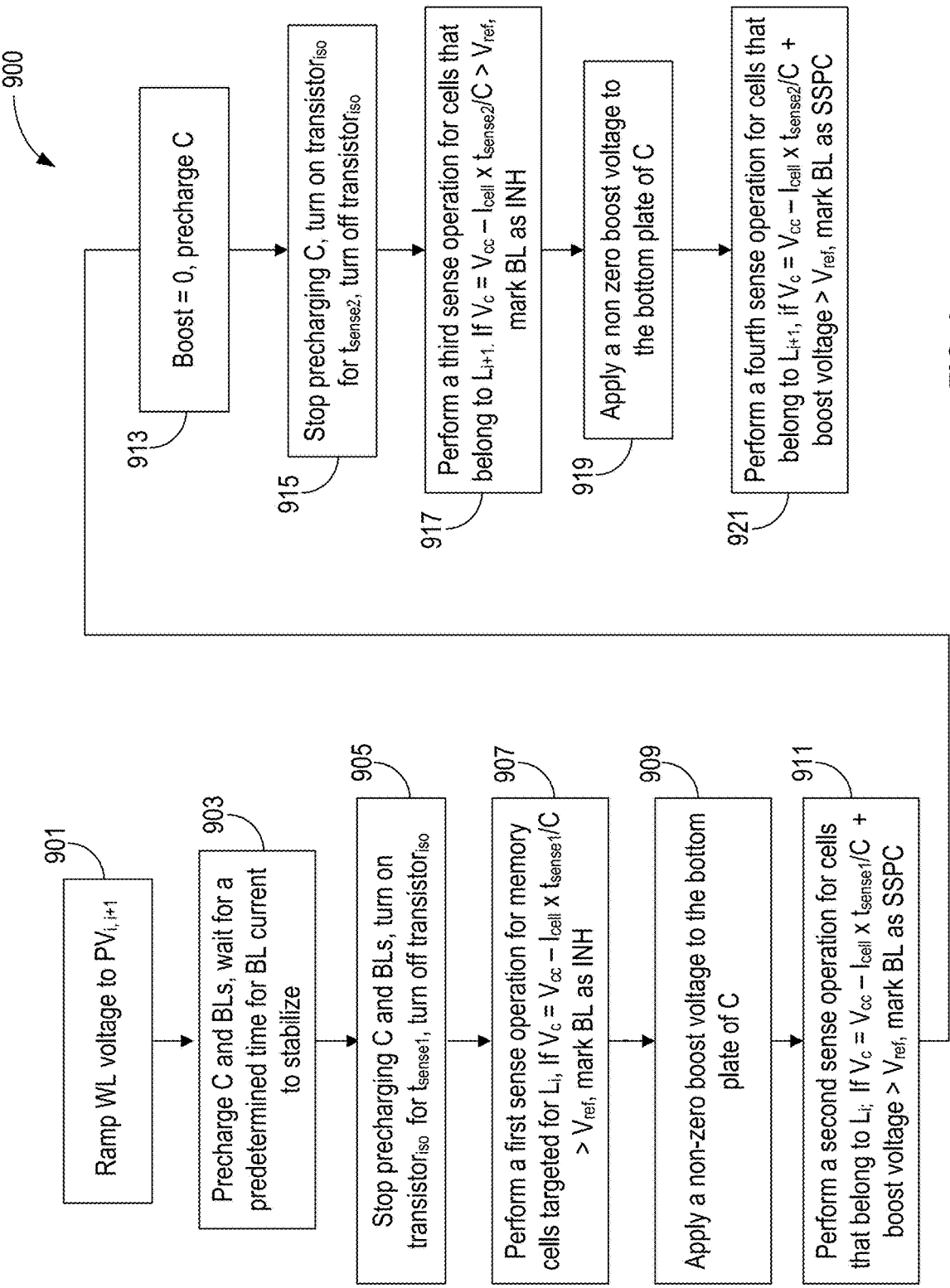
FIG. 9 is a flow diagram illustrating an example process associated with FIGS. 4-8, in accordance with embodiments of the present disclosure.

FIGS. 8 and 9 respectively illustrate an example sense circuit and a process associated with the example sense circuit, in accordance with various embodiments. In embodiments, sense circuit 800 compares a BL current to a plurality of different BL reference current levels. As illustrated, sense circuit 800 is coupled to a BL 801 and includes a transistor 805 (also labeled "BL Clamp" in FIG. 8) coupled to a pair of first and second respective precharge transistors ("pre1") 807 and ("pre2") 809. In embodiments, a transistor 808 ("isolation transistor" or "iso" as labeled in FIG. 8) is coupled between first and second precharge transistors 807 and 809 while a sense capacitor C at 812 is coupled to transistor 808, precharge transistor 809, and an input to voltage comparator 815. In embodiments, control circuitry of a memory array includes sense circuit 800 to compare a voltage level on sense capacitor 812 to a shared verify voltage level (V$_{ref}$) to determine whether a first BL current is larger than a first reference BL current. Accordingly, in embodiments, a combination of performing sense operations using a different on-time or t$_{sense}$ for transistor 808 and subtracting a voltage from V$_{ref}$ by applying a non-zero boost voltage to the bottom terminal of sense capacitor C is used to compare the memory cell current against a plurality of reference currents, such as, for example, reference currents, denoted by I$_{T1}$, I'$_{T1}$, I$_{T2}$, and I'$_{T2}$ of FIG. 7.

FIG. 9 illustrates a process 900 in connection with performance of verification operations performed in part by example sense circuit 800, in accordance with various embodiments. In embodiments, comparing a first BL current of a memory cell to a first reference BL current and a second BL current of a second memory cell to a second reference BL current includes generating the reference currents by using a combination of boost modulation and a variation of an on-time of a sense transistor in a sense circuit. In embodiments, a combination of a boost voltage on sense capacitor 812 and a time duration ("t$_{sense}$") for transistor 808 is determined or set according to a BL reference current to be compared.

Accordingly, in embodiments, at a block 901, a selected WL voltage is ramped to a shared program verify voltage level (PV$_{i, i+1}$). Next, in the embodiment, at block 903, BLs of memory cells to be verified, e.g., BL 801, and a sense capacitor ("C"), e.g., 812, of FIG. 8, are precharged. In embodiments, a predetermined wait time elapses to allow BL currents to stabilize. At a next block 905, precharge of sense capacitor C and BLs is stopped and transistor 808 is turned on for a time duration t$_{sense1}$, during which sense capacitor C is discharged by I$_{cell}$ (see FIG. 8). Accordingly, at the end of t$_{sense1}$, a voltage V$_c$ of sense capacitor C is equal V$_{cc}$-I$_{cell}$·t$_{sense1}$/C. Thus, in embodiments, at a block 907, sense circuit 800 performs a first sense operation for memory cells that are targeted for programming to program voltage level L$_i$. Accordingly, if V$_c$=V$_{cc}$-I$_{cell}$·t$_{sense1}$/C>V$_{ref}$, corresponding BLs that belong to L$_i$ are considered programmed and marked as inhibited, INH. In embodiments, V$_{ref}$ is set at the shared reference voltage level.

Next, for the embodiment, at block 909, a non-zero boost voltage V$_{boost}$ is applied to a bottom plate of sense capacitor C. As a result, in embodiments, V$_c$ is shifted to V$_{cc}$-I$_{cell}$·t$_{sense1}$/C+V$_{boost}$. Accordingly, at a next block 911, the sense circuit performs a second sense operation for cells that are targeted to be programmed to L$_i$. In embodiments, if V$_c$=V$_{cc}$-I$_{cell}$·t$_{sense1}$/C+V$_{boost}$>V$_{ref}$, corresponding BLs are marked as SSPC. In embodiments, at a next block 913, boost voltage is returned to zero, sense capacitor C is precharged again to V$_{cc}$ and the above sequence is repeated for the third and fourth sense operations as described below in connection with blocks 915-917. Accordingly, at a block 915, precharge of sense capacitor C and BLs is stopped and transistor 808 is turned on for a time duration, t$_{sense2}$. In embodiments, transistor 808 is then turned off. At a next block, 917, a third sense operation is performed for memory cells that belong to L$_{i+1}$. In embodiments, if V$_c$=V$_{cc}$-I$_{cell}$·t$_{sense2}$/C>V$_{ref}$, corresponding BLs are marked as INH. At a next block 919, a non-zero boost voltage is added to the bottom plate of C. Finally, at block 921, a fourth sense operation is performed for cells that belong to L$_{i+1}$, where if V$_c$=V$_{cc}$-I$_{cell}$·t$_{sense2}$/C+V$_{boost}$>V$_{ref}$, corresponding BLs are marked as SSPC. Accordingly, in embodiments, in a next program operation, BLs marked as SSPC will have program operations performed at a slower rate, BLs marked as INH are inhibited from being programmed, and other BLs will be programmed. Note that while the above embodiments used a combination of t$_{sense}$ and V$_{boost}$ to perform sense operations at different target currents I$_{T1}$, I'$_{T1}$, I$_{T2}$ and I'$_{T2}$, any suitable combination can be used. For example, in some embodiments, different reference voltages, V$_{ref}$ can be also used or different sense times, e.g., four different sense times, t$_{sense1}$ . . . t$_{sense4}$ may be used.

Figure 10:
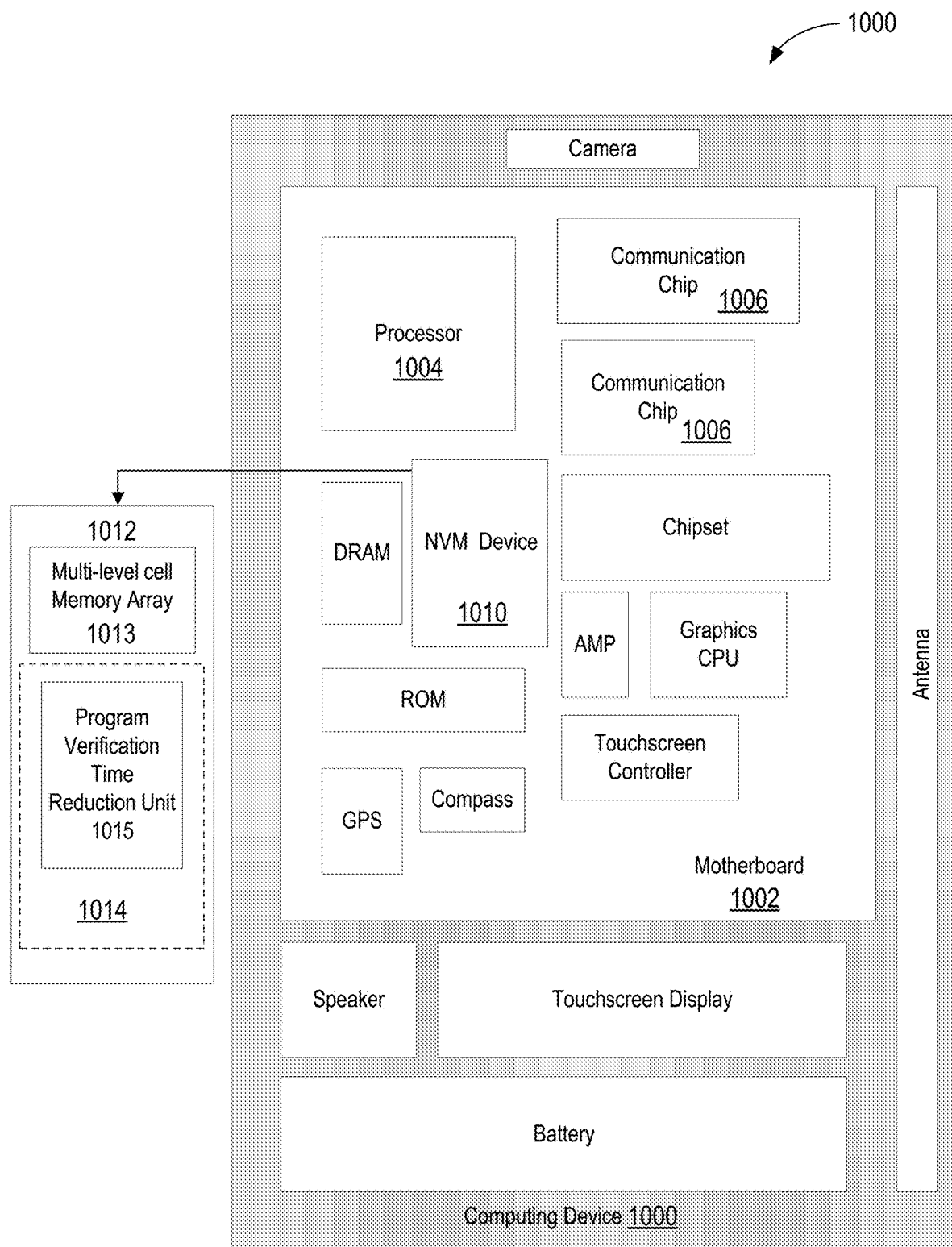
FIG. 10 a schematic of a computing system, in accordance with embodiments of the present disclosure.

FIG. 10 illustrates a computing system including a computing device 1000 that includes a memory device (e.g., a non-volatile memory device (NVM) 1010) in accordance with various embodiments of the present disclosure. In embodiments, computing device 1000 houses a board 1002, such as, for example, a motherboard. The board 1002 may include a number of components, including but not limited to a processor 1004 and at least one communication chip 1006. The processor 1004 is physically and electrically coupled to the board 1002. In some implementations, the at least one communication chip 1006 is also physically and electrically coupled to the board 1002. In further implementations, the communication chip 1006 is part of the processor 1004. In embodiments, NVM 1010 is a multi-level flash memory device, e.g., a quad-level cell (QLC) NAND device including a multi-level cell memory array ("memory array") 1013 including multi-level memory cells. The NVM 1010 may be packaged in an IC assembly (e.g., IC assembly 100 of FIG. 1) that includes the NVM 1010 that performs a program verification time reduction as described herein in accordance with some embodiments. Accordingly, in some embodiments, the memory device is a NAND memory device 1012, and includes, or is coupled to, a controller 1014. As shown, NAND memory device 1012 includes a program verification time reduction unit 1015 operable in controller 1014 to perform operations in connection with program verification time reduction as described in connection with FIGS. 1-9.

Accordingly, in embodiments, controller 1014 is coupled or included in NVM 1010 and is to perform a program operation to program a memory cell of a memory array 1013 to a program voltage level, wherein the program voltage level is one of a plurality of program voltage levels to be programmed into the memory array; and perform a verification operation by applying a shared verify voltage level to the memory array to verify that the memory cell is programmed to the program voltage level, wherein the program voltage level is one of two consecutive program voltage levels of the plurality of program voltage levels to be verified by application of the shared verify voltage level. In embodiments, program verify time reduction unit 1015 is to apply the shared verify voltage level to a selected wordline (WL) of the memory array. In embodiments, the memory cell is a first target memory cell of the array and memory controller 1014 comprises control circuitry to compare a first bitline (BL) current of the first target memory cell to a first reference BL current and a second BL current of a second target memory cell of memory array 1013 to a second reference BL current to verify that the first and second target memory cells are programmed to first and second consecutive program voltage levels of the two consecutive program voltage levels. Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die, e.g., die described in connection with the above embodiments, packaged within the communication chip 1006. In accordance with another implementation of the invention, the integrated circuit die of the communication chip includes one or more devices, such as MOS-FET transistors built in accordance with implementations of the invention.

In further implementations, another component housed within the computing device 1000 may contain an integrated circuit die that includes one or more devices, such as MOS-FET transistors built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone or other mobile device, a desktop computer, a server, a printer, a scanner, a monitor, a set-top box, an entertainment control unit, a digital camera, a portable music player, or a digital video recorder. In further implementations, the computing device 1000 may be any other electronic device that processes data.

According to various embodiments, the present disclosure describes a number of examples.

Example 1 is an apparatus that includes a multi-level-per-cell memory device comprising an array of memory cells; and control circuitry coupled to the multi-level-per-cell memory device to control programming of the memory cells, the control circuitry to perform a program operation to program a memory cell of the array to a program voltage level, wherein the program voltage level is one of a plurality of program voltage levels to be programmed into the array; and perform a verification operation by applying a shared verify voltage level to the array to verify that the memory cell is programmed to the program voltage level, wherein the program voltage level is one of two consecutive program voltage levels of the plurality of program voltage levels to be verified by application of the shared verify voltage level.

Example 2 is the apparatus of Example 1, wherein the memory cell is a first memory cell of the array and wherein to perform the verification operation includes to verify that the first memory cell is at a first program voltage level and a second memory cell of the array is at a second program voltage level of the two consecutive program voltage levels.

Example 3 is the apparatus of Example 1, wherein the multi-level-per-cell device (MLC) is a quad level (QLC) 3D-NAND non-volatile memory device and wherein the control circuitry is to apply the shared verify voltage level as a single verification voltage to a selected wordline (WL) of a first memory cell and a second memory cell.

Example 4 is the apparatus of Example 3, wherein the control circuitry comprises sense circuitry to compare a first bitline (BL) current of the first memory cell to a first reference BL current and a second BL current of the second memory cell to a second reference BL current to verify that the first and second memory cells are programmed to a respective first program voltage level and a second program voltage level.

Example 5 is the apparatus of Example 4, wherein the control circuitry to perform the verification operation further includes to determine first and second respective values for the first reference BL current and the second reference BL current.

Example 6 is the apparatus of Example 5, wherein the control circuitry is to determine that the first and second memory cells are programmed according to a determination that at the shared verify voltage level, the first BL current and the second BL current are less than the respective reference BL current and the second reference BL current.

Example 7 is the apparatus of Example 6, wherein the sense circuitry includes a sense capacitor coupled to perform a sense operation to compare the first BL current and the second BL current to the respective first reference BL current and the second reference BL including to apply a boost voltage to the sense capacitor.

Example 8 is the apparatus of any one of Examples 1-7, wherein the control circuitry is to mark one or both of the first memory cell and the second memory cell as programmed according to a determination that one or both of the memory cells have passed the shared verify voltage level.

Example 9 is a method, comprising: performing a program operation to program a memory cell of an array to a program voltage level, wherein the program voltage level is one of a plurality of program voltage levels to be programmed into the array; and performing a verification operation by applying a shared verify voltage level to the array to verify that the memory cell is programmed to the program voltage level, wherein the program voltage level is one of two consecutive program voltage levels of the plurality of program voltage levels to be verified by application of the shared verify voltage level.

Example 10 is the method of Example 9, wherein the memory cell is a first memory cell included in a first plurality of target memory cells of the array to be programmed to a first program voltage level and the array further including a second memory cell included in a second plurality of target memory cells to be programmed to a second program voltage level.

Example 11 is the method of Example 10, wherein performing the verification operation includes performing a first sense operation to determine if a bitline (BL) current of the first memory cell is less than a reference BL current and marking the first memory cell according to the determination.

Example 12 is the method of Example 11, further comprising performing a second sense operation on the first memory cell to determine if a subsequent BL current of the first memory cell is less than a selective slow program convergence (SSPC) threshold reference current.

Example 13 is the method of Example 12, further comprising performing a third sense operation on the second memory cell to determine if a BL current of the second memory cell is less than a reference BL current and marking the second memory cell according to the determination.

Example 14 is the method of Example 10, wherein performing the verification operation using the shared verify voltage level includes comparing a first bitline (BL) current of the first memory cell to a first reference BL current and a second BL current of the second memory cell to a second reference BL current.

Example 15 is the method of Example 14, wherein comparing a first bitline (BL) current of the first memory cell to a first Reference BL current and a second BL current of the second memory cell to a second reference BL current includes performing a sense operation using a combination of boost modulation and variation of an on-time of a sense transistor in a sense circuit.

Example 16 includes an apparatus comprising means for performing the method of any one of Examples 9-15, or some other example herein.

Example 17 includes a computer-readable medium including instructions stored thereon, that in response to execution of the instructions cause an electronic device to perform the method of any one of Examples 9-15, or some other example herein.

Example 18 is a system, comprising a memory device; a memory controller coupled to the memory device, wherein the memory controller is to: perform a program operation to program a memory cell of an array of the memory device to a program voltage level, wherein the program voltage level is one of a plurality of program voltage levels to be programmed into the array; and perform a verification operation by applying a shared verify voltage level to the array to verify that the memory cell is programmed to the program voltage level, wherein the program voltage level is one of two consecutive program voltage levels of the plurality of program voltage levels to be verified by application of the shared verify voltage level.

Example 19 is the system of Example 18, wherein the memory cell is a first target memory cell of the array and the memory controller comprises control circuitry to compare a first bitline (BL) current of the first target memory cell to a first reference BL current and a second BL current of a second target memory cell of the array to a second reference BL current to verify that the first and second target memory cells are programmed to first and second consecutive program voltage levels of the two consecutive program voltage levels.

Example 20 is the system of Example 18, wherein the memory controller includes a program verify time reduction unit to apply the shared verify voltage level to a selected wordline (WL) of the memory array.

Example 21 is the system of any one of Examples 18-20, wherein the memory device comprises a quad-level cell (QLC) NAND device.

Example 22 is the system of any one of Examples 18-20, further comprising a processor and a display coupled to the memory device and wherein the system comprises a mobile computing device.

Various embodiments may include any suitable combination of the above-described embodiments, including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus, comprising:
a multi-level-per-cell memory device comprising an array of memory cells; and
control circuitry coupled to the multi-level-per-cell memory device to control programming of the memory cells, the control circuitry to:
perform a program operation to program a memory cell of the array to a program voltage level, wherein the program voltage level is one of a plurality of program voltage levels to be programmed into the array;
perform a verification operation by applying a shared verify voltage level to the array to verify that the memory cell is programmed to the program voltage level, wherein the shared verify voltage level is a single verification voltage applied to a selected wordline (WL) of a first memory cell and a second memory cell and is to verify at least two consecutive program voltage levels of the plurality of program voltage levels, and the program voltage level is one of two consecutive program voltage levels of the plurality of program voltage levels to be verified by application of the shared verify voltage level; and
wherein the control circuitry comprises sense circuitry to compare a first bitline (BL) current of the first memory cell to a first reference BL current and a second BL current of the second memory cell to a second reference BL current to verify that the first memory cell and second memory cell are programmed to a respective first program voltage level and second program voltage level of the two consecutive program voltage levels.

2. The apparatus of claim 1, wherein the control circuitry to perform the verification operation further includes to determine first and second respective values for the first reference BL current and the second reference BL current.

3. The apparatus of claim 2, wherein the control circuitry is to determine that the first and second memory cells are programmed according to a determination that at the shared verify voltage level, the first BL current and the second BL current are less than the respective first reference BL current and the second reference BL current.

4. The apparatus of claim 3, wherein the sense circuitry includes a sense capacitor coupled to perform a sense operation to compare the first BL current and the second BL current to the respective first reference BL current and the second reference BL including to apply a boost voltage to the sense capacitor.

5. The apparatus of claim 1, wherein the control circuitry is to mark one or both of the first memory cell and the second memory cell as programmed according to a determination that one or both of the memory cells have passed the shared verify voltage level.

6. A method, comprising:
performing a program operation to program a memory cell of an array to a program voltage level, wherein the program voltage level is one of a plurality of program voltage levels to be programmed into the array; and
performing a verification operation by applying a shared verify voltage level to the array to verify that the memory cell is programmed to the program voltage level, wherein the shared verify voltage level is a single verification voltage applied to a selected wordline (WL) of a first memory cell and a second memory cell and is used to verify at least two consecutive program voltage levels of the plurality of program voltage levels, and wherein the program voltage level is one of two consecutive program voltage levels of the plurality of program voltage levels to be verified by application of the shared verify voltage level; and
wherein performing the verification operation using the shared verify voltage level includes comparing a first bitline (BL) current of the first memory cell to a first reference BL current and a second BL current of the second memory cell to a second reference BL current to verify that the first memory cell and second memory cell are programmed to a respective first program voltage level and second program voltage level of the two consecutive program voltage levels.

7. The method of claim 6, wherein performing the verification operation includes performing a first sense operation to determine if the first bitline (BL) current of the first memory cell is less than the first reference BL current and marking the first memory cell according to the determination.

8. The method of claim 7, further comprising performing a second sense operation on the first memory cell to determine if a subsequent BL current of the first memory cell is less than a selective slow program convergence (SSPC) threshold reference current.

9. The method of claim 8, further comprising performing a third sense operation on the second memory cell to determine if a BL current of the second memory cell is less than the second reference BL current and marking the second memory cell according to the determination.

10. The method of claim 6, wherein comparing the first bitline (BL) current of the first memory cell to the first reference BL current and the second BL current of the second memory cell to the second reference BL current includes performing a sense operation using a combination of boost modulation and variation of an on-time of a sense transistor in a sense circuit.

11. A system, comprising:
a memory device;
a memory controller coupled to the memory device, wherein the memory controller is to:
perform a program operation to program a memory cell of an array of the memory device to a program voltage level, wherein the program voltage level is one of a plurality of program voltage levels to be programmed into the array; and
perform a verification operation by applying a shared verify voltage level to the array to verify that the memory cell is programmed to the program voltage level, wherein the shared verify voltage level is a single verification voltage applied to a selected wordline (WL) of a first memory cell and a second memory cell and is to verify at least two consecutive program voltage levels of the plurality of program voltage levels, and wherein the program voltage level is one of two consecutive program voltage levels of the plurality of program voltage levels to be verified by application of the shared verify voltage level; and
wherein control circuitry comprises sense circuitry to compare a first bitline (BL) current of the first memory cell to a first reference BL current and a second BL current of the second memory cell to a second reference BL current to verify that the first and second memory cells are programmed to a respective consecutive first program voltage level and a second program voltage level.

12. The system of claim 11, wherein the memory controller includes a program verify time reduction unit to apply the shared verify voltage level to a selected wordline (WL) of the memory array.

13. The system of claim 12, wherein the memory device comprises a quad-level cell (QLC) NAND device.

14. The system of claim 11, further comprising a processor and a display coupled to the memory device and wherein the system comprises a mobile computing device.

\* \* \* \* \*